United States Patent [19]

Colak et al.

[11] Patent Number: 4,989,058
[45] Date of Patent: Jan. 29, 1991

[54] FAST SWITCHING LATERAL INSULATED GATE TRANSISTORS

[75] Inventors: Sel Colak, Ossining, N.Y.; Valdimir Rumennik, Los Altos, Calif.

[73] Assignee: North American Philips Corp., New York, N.Y.

[21] Appl. No.: 275,637

[22] Filed: Nov. 22, 1988

Related U.S. Application Data

[63] Continuation-in-part of Ser. No. 54,081, May 22, 1987, abandoned, which is a continuation-in-part of Ser. No. 802,781, Nov. 27, 1985, abandoned.

[51] Int. Cl.[5] ............... H01L 29/78; H01L 27/02
[52] U.S. Cl. .................. 357/23.8; 357/6; 357/15; 357/20; 357/23.1; 357/41; 357/51; 357/86
[58] Field of Search ............ 357/6, 15, 20, 23.1, 357/23.4, 23.8, 51, 41, 86

[56] References Cited

U.S. PATENT DOCUMENTS

| | | | |
|---|---|---|---|
| 3,788,904 | 6/1974 | Haraszti | 357/15 |
| 4,199,774 | 4/1980 | Plummer | 357/23.4 |
| 4,250,519 | 2/1981 | Mogi et al. | 357/23.4 |
| 4,270,137 | 5/1981 | Coe | 357/23.4 |
| 4,300,152 | 11/1981 | Lepselter | 357/15 |
| 4,300,250 | 11/1981 | Colak | 357/13 |
| 4,358,782 | 10/1982 | Takasuka et al. | 357/6 |
| 4,513,309 | 4/1985 | Cricchi | 357/15 |
| 4,633,282 | 12/1986 | Leg | 357/22 |
| 4,639,761 | 1/1987 | Singer et al. | 357/23.8 |
| 4,694,313 | 9/1987 | Beasom | 357/41 |

FOREIGN PATENT DOCUMENTS

0111803 6/1984 European Pat. Off.
0115098 8/1984 European Pat. Off. ........... 357/23.4

OTHER PUBLICATIONS

R. Jayaraman et al., "Comparison of High Voltage Devices for Power Integrated Airwater", *DEDM 84* pp. 258-260.
S. Colak et al., "Lateral DMOS Power Trademark Design" *IEEE Electron Review Letters,* Oct. EDL-1 (Apr. 1980) pp. 51-53.

Primary Examiner—J. Carroll
Attorney, Agent, or Firm—Steven R. Biren

[57] ABSTRACT

A lateral insulated gate transistor includes both a surface-adjoining drain region and a surface-adjoining anode region in an epitaxial surface layer. An anode-drain electrode is connected to the anode region and coupled to the drain region. In one embodiment of the device, the drain and anode regions are in direct contact, and the anode-drain electrode directly contacts both regions. In a second embodiment, the anode region is provided in a high-doped surface-adjoining region rather than in direct contact with the drain region, and the anode-drain electrode is coupled to the drain region through a resistive element. A third embodiment employs a Schottky contact connected to the anode-drain electrode. Lateral isolated gate rectifiers in accordance with the invention offer the advantages of low "on" resistance, high breakdown voltage and fast switching characteristics.

5 Claims, 3 Drawing Sheets

FAST SWITCHING LATERAL INSULATED GATE TRANSISTORS

This is a continuation-in-part of application Ser. No. 054,081, filed May 22, 1987, which was a continuation-in-part of application Ser. No. 802,781, filed Nov. 27, 1985, both now abandoned.

BACKGROUND OF THE INVENTION

The invention is in the field of metal-oxide-semiconductor (MOS) field-effect devices, and relates specifically to lateral insulated gate transistors.

MOS devices are generally well-known in the art, and a typical prior art high-voltage lateral DMOS transistor is shown in FIG. 1 of U.S. Pat. No. 4,300,150. This device includes a semiconductor substrate of a first conductivity type (p-type), an epitaxial surface layer of a second conductivity type (n-type) on a major surface of the substrate, a surface-adjoining channel region of the first conductivity type in the epitaxial layer, a surface-adjoining source region of the second conductivity type in the channel region, and a surface-adjoining drain region of the second conductivity type in the epitaxial layer and spaced apart from the channel region. An insulating layer is provided on the epitaxial surface layer and covers at least that portion of the channel region located between the source and drain. A gate electrode is provided on the insulating layer, over the portion of the channel region located between the source and drain and is electrically isolated from the epitaxial surface layer by the insulating layer (referred to as the gate oxide), while source and drain electrodes are connected respectively to the source and drain regions of the transistor. Such prior art high-voltage DMOS transistors typically have a relatively thick epitaxial layer, in the order of about 25-30 micrometers for a breakdown voltage of about 250 V.

It has been found that the breakdown characteristics of high-voltage semiconductor devices can be improved by using the REduced SURface Field (or RESURF) technique, as described in "High Voltage Thin Layer Devices (RESURF Devices)", "International Electronic Devices Meeting Technical Digest", Dec., 1979, pages 238-240, by Appels et al, and U.S. Pat. No. 4,292,642, incorporated hereby by reference. Essentially, the improved breakdown characteristics of RESURF devices are achieved by employing thinner but more highly doped epitaxial layers to reduce surface fields. Additionally, surface and buried regions having no direct external connections have been used to redistribute surface fields in MOS devices, as shown, for example, in U.S. Pat. No. 4,300,150 and Japanese Kokai No. 45074-81. The use of Schottky contacts in field effect transistors is described in the article entitled "Analysis and Characterization of the Hybrid Schottky Injection Field Effect Transistor", International Electronic Devices Meeting, 1986, IDEM86, pages 222-224, by J. K. O. Sin, et al.

The RESURF technique was applied to lateral double-diffused MOS transistors, as reported in "Lateral DMOS Power Transistor Design", "IEEE Electron Device Letters", Vol. EDL-1, pages 51-53, Apr., 1980, by Colak et al, and the result was a substantial improvement in device characteristics. In high-voltage DMOS devices, there is normally a trade-off between breakdown voltage and "on" resistance, with the goal being to increase the breakdown voltage level while maintaining a relatively low "on" resistance. Using the RESURF technique, and for reference assuming a constant breakdown voltage, an improvement (e.g. decrease) in "on" resistance by a factor of about 3 may be obtained in a device occupying the same area as a conventional (thick epitaxial layer) DMOS device. Nevertheless, a further improvement in the "on" resistance characteristics of such devices would be extremely desirable, particularly for high-voltage power devices where "on" resistance is an important parameter. Ideally, such an improvement should be obtained without significantly degrading breakdown voltage or switching characteristics.

In seeking to create more efficient power switching devices, a new type of device, the Lateral Insulated Gate Transistor (hereinafter LIGT) was recently developed. Various LIGT structures are shown in European Patent Application No. 0 111 803. The LIGT essentially modifies the LDMOS structure of the general type described above with an anode region implanted near the drain region. In the LIGT, during the "on" state, current is conducted by the electron-hole plasma. The electrons are injected from the accumulation region under the gate and the holes are injected from the anode, resulting in conductivity modulation of the drift region. The current is dominated by the recombination mechanism in a manner similar to a p-i-n diode. As current increases, size of the holes injected by the anode flow through the substrate, forward biasing the epi-substrate junction. The substrate becomes partially conductivity-modulated and also contributes to the recombination current. At a high current level, holes injected from the anode may flow through the channel resistance, forward biasing the double-diffused junction, and thus resulting in latch-up.

In the LIGT, the addition to the anode region changes the mechanism of the current conduction in the device's drift region. In the "on" state, the current is initially conducted by the majority carriers, as in LDMOS transistors. Electrons flow from the source through the gated inversion region, through the drift region (which is the largest contributor towards the "on" resistance), and then into the drain. When drain current reaches a level high enough to forward bias the drain junction, the drain starts injecting holes into the drift region, forming a neutral plasma. The density of these injected minority carriers is higher than the doping level of the impurities in the drift region. The injected carriers modulate the resistance of the drift region, thus reducing overall "on" resistance. The injected minority carriers can flow both into the substrate and onto the channel region.

Although the LIGT offers several important advantages, including high current handling capabilities, low "on" resistance and high breakdown voltage, these devices have heretofore suffered from a significant drawback. In the LIGT, the turn-off process is determined by recombination of minority carriers, and since no contact is provided for the removal of electrons, the turn-off time is relatively long. Typically, turn-off times are in the range of 3-10 microseconds, while turn-on times are much less than 1 microsecond. This drawback is described in "Comparison of High Voltage Devices for Power Integrated Circuits", by Jayaraman, Rumennik et al, International Electron Devices Meeting, pp. 258-261, Dec., 1984.

SUMMARY OF THE INVENTION

It is therefore an object of the present invention to provide a lateral insulated gate transistor device which has high current handling capabilities, low "on" resistance and high breakdown voltage, and which is process-compatible with bipolar and MOS control circuits.

It is a further object of the invention to provide an LIGT device with the mentioned advantages which also exhibits fast switching characteristics.

In accordance with the invention, these objectives are achieved by an LIGT device of the type described above in which a surface-adjoining anode region of the first conductivity type is provided in the epitaxial layer adjacent the drain region, and in which an anode-drain electrode is connected to the anode region and coupled to the drain region. In a preferred embodiment of the invention, the drain and anode regions are side-by-side and in direct contact with each other, and the anode-drain electrode directly contacts both the drain region and the anode region. In another preferred embodiment, the drain and anode regions are not in the direct contact, and a highly-doped surface-adjoining region of the second conductivity type is provided, with the anode region being located in the highly-doped surface-adjoining region. In this embodiment, the anode-drain electrode is directly connected to the anode region and is coupled to the drain region through a resistive element. Also, LIGT operation can be achieved either with an oppositely-doped (compared to the drift region) anode region, or with a Schottky contact at the drain.

By providing an anode region in either of the fashions described above, and appropriately contacting both the anode and drain regions with a common anode-drain electrode, an LIGT device is obtained which retains the advantages of earlier devices and also exhibits fast switching characteristics. A trade-off between switching speed and "on" resistance can be achieved if the surface-adjoining anode region of the first conductivity type is replaced by a Schottky contact at the drain. The conductivity modulation effects in both cases were confirmed in experiments with DMOS devices. While Schottky contacts are not usually used in injection applications with these types of devices, due to low injector efficiency, it has been found that the Schottky embodiments disclosed herein unexpectedly provide a good combination of switching speed and "on" resistance characteristics in LIGT devices.

DESCRIPTION OF THE PREFERRED EMBODIMENTS

Figure 1:
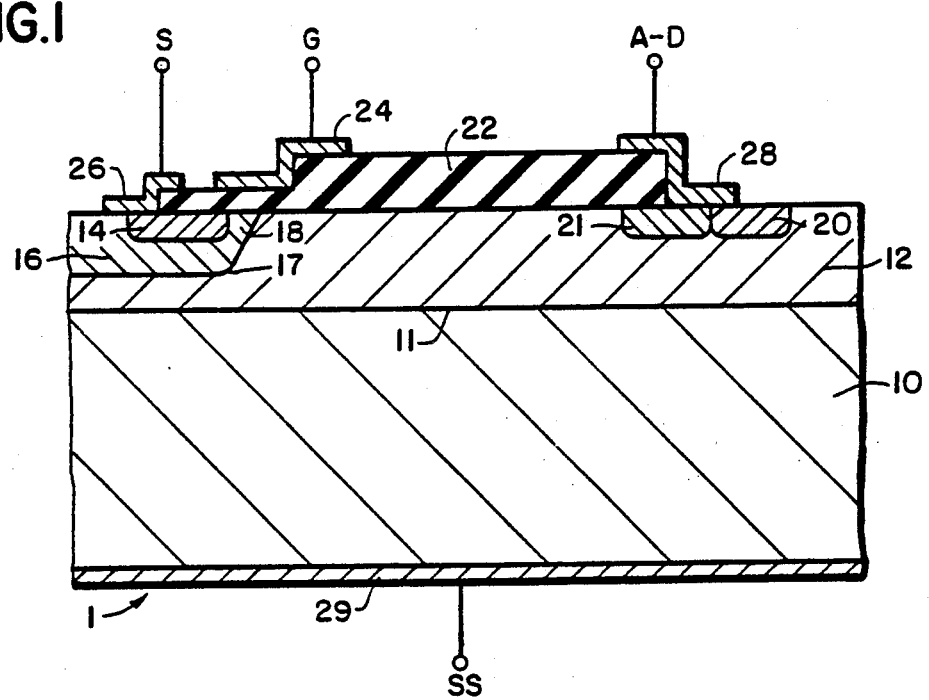
FIG. 1 is a cross-sectional view of a lateral insulated gate transistor in accordance with a first embodiment of the invention.

FIG. 1 of the drawing shows a fast switching lateral insulated gate transistor suitable for high-voltage applications. It should be noted that the Figures are not drawn to scale, and in particular the vertical dimensions are exaggerated for improved clarity. Additionally, semiconductor regions of the same conductivity type are generally shown hatched in the same direction.

In FIG. 1, a lateral device 1 has a semiconductor substrate 10 of a first conductivity type, here p-type, with an epitaxial surface layer 12 of a second conductivity type opposite to that of the first, here n-type, on a first major surface 11 of the substrate. A surface-adjoining channel region 16 of the first conductivity type is provided in the epitaxial layer and forms a p-n junction 17 therewith. A surface-adjoining source region 14 of the second conductivity type is provided in the channel region 16, and a surface-adjoining drain region 20, also of the second conductivity type, is provided in the epitaxial layer 12 at a location which is spaced apart from the channel region 16. The channel region 16 has a surface-adjacent portion 18 located between the source and drain regions which forms the channel of the device. An insulating layer 22 is provided on the epitaxial surface layer 12 and covers at least that portion of the channel region 16 located between the source and drain regions of the transistor. While insulating layer 22 is shown as a stepped layer and is of silicon oxide, other configurations and insulating materials can be used without departing from the scope of the invention. A gate electrode 24 (terminal G) is provided on the insulating layer 22 over the channel 18, and source (26) and drain (28) electrodes (terminals S and D, respectively) provide electrical connections to the source and drain regions of the transistor. A substrate electrode 29 (terminal SS) provides an electrical connection to the second major surface of the substrate on its lower side. Devices of this general type (as so far described) are well known in the art, and hence will not be described in further detail.

The Reduced Surface Field (RESURF) technique, as described in the previously-mentioned Colak et al paper, can be used to improve "on" resistance and/or breakdown voltage in devices of this type. By substantially reducing the epitaxial layer thickness, down to about 3 to 15 micrometers, while at the same time increasing the doping level in the epitaxial layer to maintain an acceptable "on" resistance value, a substantial improvement in high-voltage breakdown characteristics can be obtained. Thus, the device, as so far described, may also be a RESURF MOS device, assuming that the appropriate thickness and resistivity values for the epitaxial layer 12 are selected. In accordance with the RESURF technique, the product of doping concentration and epitaxial layer thickness ($N_{epi} \times d_{epi}$) should typically be approximately $2 \times 10^{12}$ atoms/cm$^2$. Using this technique, "on" resistance can be reduced by a factor of about 3 for a device occupying the same area as a conventional device, while maintaining the same breakdown voltage.

As described in the Jayaraman, Rumennik et al publication mentioned above, the basic lateral insulated gate transistor structure is obtained by modifying the MOS structure of the type previously described by adding an anode region of the first conductivity type within the drain region. A typical prior-art LIGT device of this type is shown in FIG. 1 (b) of the Jayaraman, Rumennik et al article. As previously noted, while LIGT devices of this type offer several important advantages, they suffer from the important drawback of a relatively long (3–10 microsecond) turn-off time. In order to overcome this drawback, the device shown in FIG. 1 additionally includes a surface-adjoining anode region 21 of the first conductivity type, here p-type, in the epitaxial layer and adjacent and in contact with the drain region 20. The device is further modified by having the drain electrode 28 directly contact both the anode region 21 and the drain region 20, thus becoming an anode-drain (A-D) electrode in this embodiment.

In the structure of FIG. 1, the anode region 21, by way of example, is a highly-doped p-type region having a doping concentration of about $10^{20}$ atoms/cm$^3$ and a thickness of about 1 micron. The remaining portions of the device structure are configured and doped in accordance with conventional techniques for fabricating lateral MOS and RESURF transistors, such as those shown in Colak U.S. Pat. No. 4,300,150.

Figure 2:
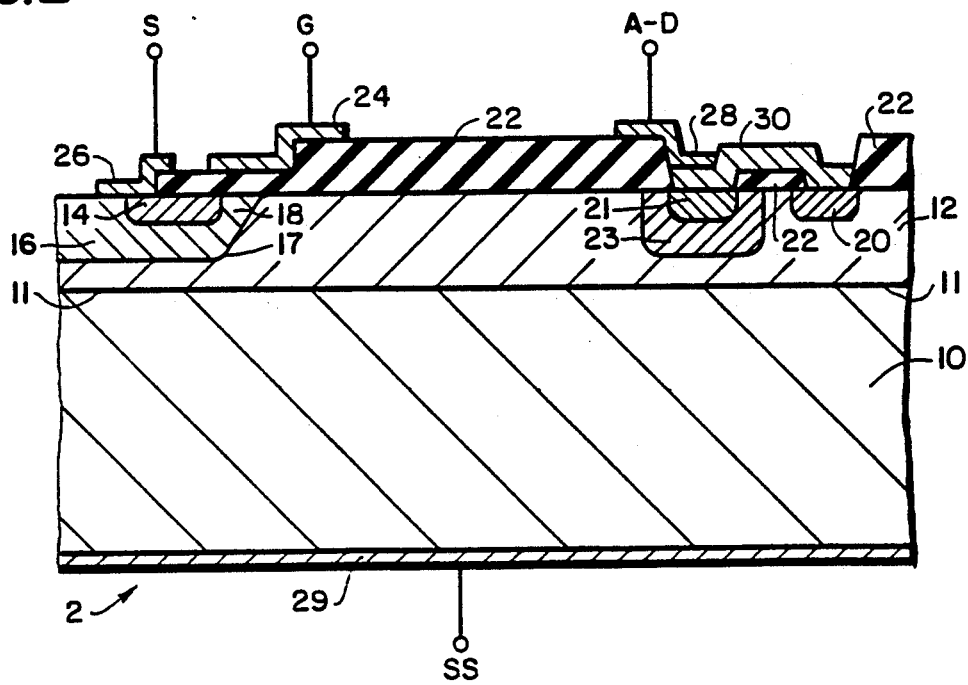
FIG. 2 is a cross-sectional view of a LIGT device in accordance with a second embodiment of the invention.

In a second embodiment ct the invention, as shown in FIG. 2, a modified form of anode-drain configuration is shown. In FIG. 2, the p-type anode region 21 of device 2 is provided in a surface-adjoining region 23 of n-type conductivity with a doping concentration of about $10^{17}$–$10^{18}$ atoms/cm$^3$ and a thickness of about 1.5 micron. Drain region 20, of n-type material, is then provided adjacent but not in direct contact with the anode region.

The drain region 20 is coupled to anode region 21 by means of a resistive element 30, which may be of polysilicon or other suitable resistive material. A portion of insulating layer 22 is provided beneath resistive element 30, as shown in FIG. 2, in order to prevent electrical contact between the resistive element and either highly-doped surface-adjoining region 23, or epitaxial surface layer 12. The construction of the device shown in FIG. 2, insofar as it differs from the previously-described device of FIG. 1, is completed by the provision of anode-drain electrode 28 on resistive element 30. A portion of anode-drain electrode 28 is provided directly above anode region 21, so that the anode-drain electrode is connected substantially directly to the anode region through the thickness of resistor element 30 (shown much magnified in FIG. 2) or directly through a window in the resistive material. Additionally, the anode-drain electrode is resistively coupled to the drain region 20 by the series resistance of resistive element 30 along substantially its entire length, which can be appropriately selected to achieve the desired resistance.

Figure 3:
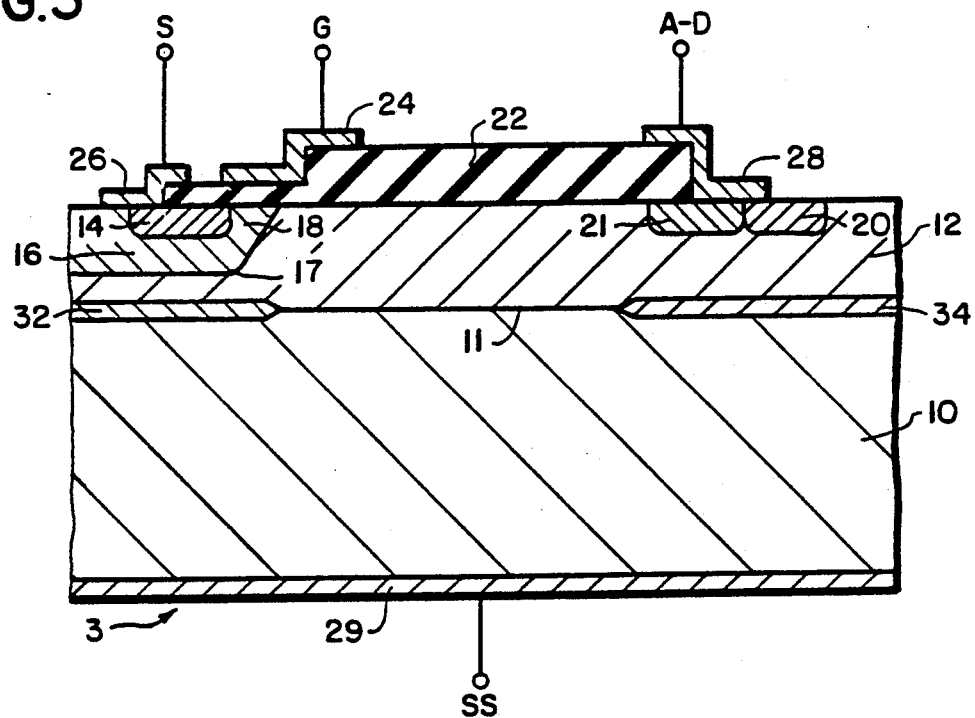
FIG. 3 is a cross-sectional view of a LIGT device showing a modified embodiment of the device shown in FIG. 1.
Figure 4:
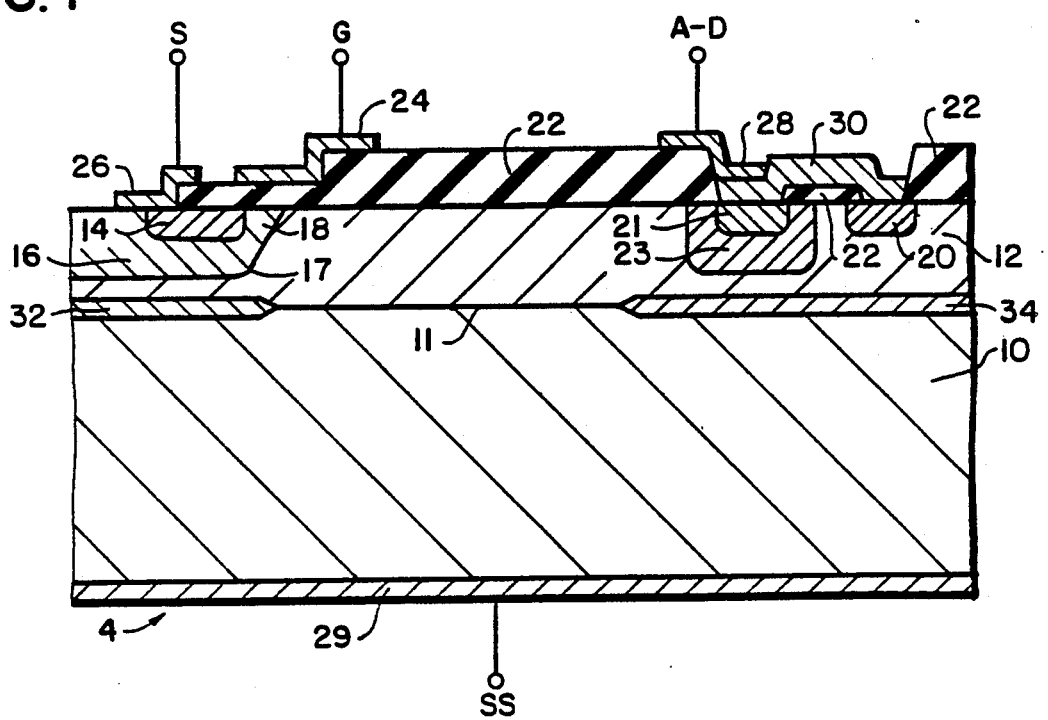
FIG. 4 is a cross-sectional view of a LIGT device showing a modified form of the device shown in FIG. 2.

Further embodiments of the devices shown in FIG. 1 and FIG. 2 are shown in FIGS. 3 and 4, respectively. The surface-adjoining device structures of the devices shown in FIGS. 3 and 4 correspond to the devices shown in FIGS. 1 and 2, respectively. The devices 3 and 4 of FIGS. 3 and 4 differ from the previously-described embodiments in that they are additionally provided with a first buried layer 32 of p-type conductivity and a doping level of about $5 \times 10^{16}$ atoms/cm$^3$ located at the first major surface 11 of the substrate 10 and beneath the source and channel regions. A second buried layer 34 of n-type conductivity and a doping level of about $10^{17}$ atoms/cm$^3$ is also provided at first major surface 11 and beneath anode region 21 and drain region 20. The thickness of buried layers 32 and 34 may be between about 1–5 microns.

Lateral insulated gate transistors in accordance with the invention, as described above, may be fabricated starting with a p-type substrate having a doping level of about $5.0 \times 10^{14}$ atoms/cm$^3$ on which is grown an n-type epitaxial layer having a thickness of about 7 micrometers and a doping level about $3.0 \times 10^{15}$ atoms/cm$^3$ The source, channel, anode, drain and the surface adjoining region (present in the embodiments shown in FIGS. 2 and 4) are then provided by conventional implantation and diffusion techniques. The doping level of the n-type regions may typically be about $10^{20}$ atoms/cm$^3$ and the doping level of the p-type regions may be about $10^{18}$ atoms/cm$^3$. The device construction is then completed by the provision, in a conventional matter, of the insulating layer 22, of silicon oxide or an equivalent dielectric, the resistive element 30 of polysilicon or the like, and the source, gate, substrate and anode-drain electrodes.

In terms of operation, the LIGT devices of the present invention are connected and operated in substantially the same manner as prior art LDMOST devices. General operating characteristics of the LIGT are described in some detail in the previously-mentioned Jayaraman, Rumennik et al publication. The devices of the present invention have been developed to incorporate the previously-mentioned advantages of LIGT-type devices in a structure which also features a relatively rapid turn-off time. This is accomplished in the present invention by providing several unique configurations of the anode, drain and anode-drain electrode portions of the devices. In prior art LIGT devices, such as that shown in FIG. 1b of the Jayaraman, Rumennik et al article, the turn-off process is determined by recombination of minority carriers, since no contact path is provided for the removal of minority characters from the drift region. In the present invention, this problem is overcome by restructuring the drain-anode portion of the device to provide two regions, and then coupling both of these regions to the anode-drain electrode. In this manner, the minority carriers can be much more rapidly removed, and turn-off times accordingly are substantially reduced. For example, in experimental devices constructed in accordance with FIG. 1, turn-off times of about 150 nanoseconds have been measured. This constitutes at least a 20 times improvement over the prior art. These devices were also able to switch at least 100 volts at the drain electrode, and had an on-state resistance five times lower than comparable LDMOS transistors. In the "off" state, the gate, source, and substrate were at 0 volts and the drain was at 100 volts. In the "on" state, the source and substrate were at 0 volts and a voltage of 20 volts was applied to the gate. After a brief transition, the drain voltage stabilized at about 1 volt.

In order to obtain additional flexibility in device design, the embodiment shown in FIG. 2, using resistive element 30 to couple drain region 20 to anode region 21 and anode-drain electrode 28, may be employed. In this embodiment, at low current levels, the source current for the most part flows into the drain region 20, then through the resistance of resistive region 30 (typically about 1–5 ohms) and then into the anode-drain electrode 28. As the current increases, due to an increase in the gate voltage, the anode region 21 supplies sufficient carriers to modulate the conductivity of the epitaxial layer, and most of the current flows into the anode region and then substantially directly to the anode-drain electrode 28. The ratio of currents flowing into the drain electrode 28 from the drain and anode regions can be controlled by selecting the resistance value of resistive element 30, as well as the distance between the anode and drain regions and the epitaxial layer resistivity. As in the previously-described embodiment, turn-off times are substantially improved by providing a path for removing minority carriers through the drain region, a mode of operation not possible in the prior-art configurations.

The high-voltage breakdown characteristics of the devices shown in FIGS. 1 and 2 can be further improved by incorporating the previously-described buried layers 32 and 34, as shown in the embodiments of FIGS. 3 and 4. In these structures, the buried layer 32 is of p-type conductivity, and serves to enhance breakdown voltage characteristics, while the buried layer 34 is of n-type conductivity and serves to prevent punch-through. The doping level of buried layer 32 is about $5 \times 10^{16}$ atoms cm$^3$, and that of the buried layer 34 is about $10^{17}$ atoms/cm$^3$.

Figure 5A:
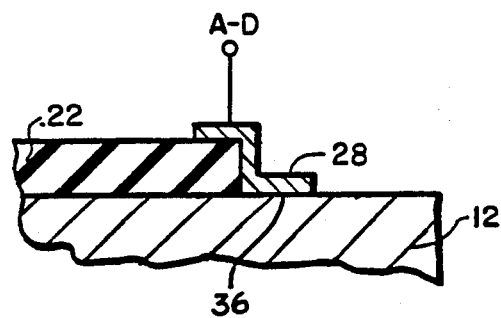
FIGS. 5a, 5b and 5c are partial cross-sectional views of the above embodiments showing modified forms of the above embodiments.
Figure 5B:
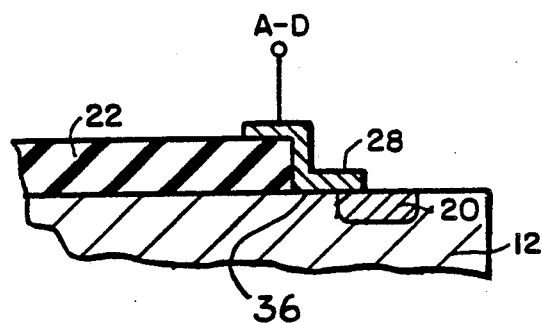
Figure 5C:
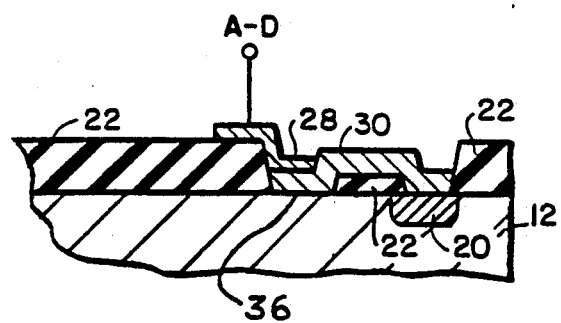

As previously mentioned, minority carrier injection and conductivity modulation in the drift region can be achieved by a Schottky contact 36 as shown in FIG. 5a, which is a modification of the devices shown in FIGS. 1 and 3. More specifically, the structure shown in FIG. 5a is an alternate embodiment for the anode-drain (upper right-hand corner) area of FIGS. 1 and 3. A second alternate configuration for this area of th devices shown in FIGS. 1 and 3 is shown in FIG. 5b. This embodiment employs the Schottky contact 36 in combination with the previously-described drain region 20 of the second conductivity type. Finally, an embodiment showing the use of the Schottky contact 36 in the embodiments of FIGS. 2 and 4 is shown in FIG. 5c. Again, FIG. 5c is an alternate embodiment for the anode-drain (upper right-hand corner) area of FIGS. 2 and 4.

In each of the embodiments shown in FIGS. 5a, 5b and 5c, the Schottky contact 36 is provided by a suitable known Schottky contact material, such as aluminum, platinum silicide, or gold, at the area 36. In FIGS. 5a and 5b, the electrode 28 may be made of the selected Schottky contact material, while in FIG. 5c, a thin layer of the selected Schottky contact material may be provided beneath resistive element 30 at the area 36. Further embodiments of the present invention, based upon the Schottky structures shown in FIGS. 5a, 5b and 5c, include a very thin silicon oxide layer located at the horizontal line shown by reference numeral 36, between the Schottky contact material and the surface of the epitaxial surface layer 12. This very thin oxide layer is only about 100 Å thick, and so is shown only as line 36 in FIGS. 5a, 5b and 5c, since the surrounding layers are several orders of magnitude thicker. The purpose of the very thin oxide layer is to increase injection efficiency of the shown devices.

A particularly advantageous Schottky structure can be obtained by fabricating this very thin oxide layer with so-called "pinholes" or apertures, so that the Schottky contact material makes actual electrical contact with the surface of epitaxial surface layer 12 at the locations of the "pinholes". In view of the extreme thinness of the oxide layer, these "pinholes" will appear automatically during fabrication, so long as no special precautions are taken to ensure a continuous, defect-free oxide layer.

In summary, devices in accordance with the present invention are capable of providing all of the advantages associated with prior-art LIGT, devices, such as high current handling capability, low "on" resistance and high breakdown voltage, while at the same time overcoming the most significant drawback of prior structures, namely the relatively long turn-off time inherent in such devices.

While the invention has been particularly shown and described with reference to several preferred embodiments thereof, it will be understood by those skilled in the art that various changes in form and detail may be made without departing from the spirit and scope of the invention.

We claim:

1. A lateral insulated gate transistor having a semiconductor substrate of a first conductivity type, an epitaxial surface layer of a second conductivity type opposite to that of the first on a first major surface of said substrate, a surface-adjoining channel region of said first conductivity type in said epitaxial layer and forming a p-n junction therewith, a surface-adjoining source region of said second conductivity type in said channel region, a surface-adjoining drain region of said second conductivity type in said epitaxial layer and spaced apart from said channel region, a surface-adjoining anode region of said first conductivity type in said epitaxial layer, adjacent said drain region, and closer to said drain region than to said channel region, an insulating layer on said epitaxial surface layer and covering at least that portion of said channel region located between said source region and said drain region, a gate electrode on said insulating layer, over said portion of the channel region and electrically isolated from said surface layer, a source electrode connected to the source region of said transistor, a single anode-drain electrode connected to said anode region and coupled to said rain region, and a substrate electrode on a second major surface of said substrate opposite to the first, the product of doping concentrating and epitaxial layer thickness of said epitaxial layer being about $2 \times 10^{12}$ atoms/cm$^2$, wherein said adjacent surface-adjoining drain and anode regions are side-by-side and in direct physical contact with each other, and wherein said anode-drain electrode directly contacts both said drain region and said anode region, and further comprising a first barrier layer of said first conductivity type located at the first major surface of said substrate and beneath said source and channel regions, and a second buried layer of said second conductivity type located at the first major surface of said substrate and beneath said anode and drain regions.

2. A lateral insulated gate transistor having a semiconductor substrate of a first conductivity type, an epitaxial surface layer of a second conductivity type opposite to that of the first on a first major surface of said substrate, a surface-adjoining channel region of said first conductivity type in said epitaxial layer and forming a p-n junction therewith, a surface-adjoining source region of said second conductivity type in said channel region, a surface-adjoining drain region of said second conductivity type in said epitaxial layer and spaced apart from said channel region, a surface-adjoining anode region of said first conductivity type in said epitaxial layer, adjacent said drain region, and closer to said drain region than to said channel region, an insulating layer on said epitaxial surface layer and covering at least that portion of said channel region located between said source region and said drain region, a gate electrode on said insulating layer, over said portion of the channel region and electrically isolated from said surface layer, a source electrode connected to the source region of said transistor, a single anode-drain electrode connected to said anode region and coupled to said drain region, and a substrate electrode on a second major surface of said substrate opposite to the first, the product of doping concentration and epitaxial layer thickness of said epitaxial layer being about $2 \times 10^{12}$ atoms/cm$^2$, wherein said adjacent surface-adjoining drain and anode regions are not in direct physical contact, further comprising a surface-adjoining region of the second conductivity type, said anode region being provided in said surface-adjoining region of the second conductivity type, and further comprising a first buried layer of said first conductivity type located at the first major surface of said substrate and beneath said source and channel regions, and a second buried layer of said second conductivity type located at the first major surface of said substrate and beneath said anode and drain regions.

3. A lateral insulated gate transistor having a semiconductor substrate of a first conductivity type, an epitaxial surface layer of a second conductivity type opposite to that of the first on a first major surface of said substrate, a surface-adjoining channel region of said first conductivity type in said epitaxial layer and forming a p-n junction therewith, a surface-adjoining source region of said second conductivity type in said channel region, a Schottky contact at a surface of said epitaxial layer and spaced apart from said channel region, an insulating layer on said epitaxial surface layer and covering at least that portion of said channel region located between said source region and said Schottky contact, a gate electrode on said insulating layer, over said portion of the channel region and electrically isolated for said surface layer, a source electrode connected to the source region of said transistor, a single anode-drain electrode connected to said Schottky contact, a substrate electrode on a second major surface of said substrate opposite to the first, and a very thin silicon oxide layer directly on a surface of said epitaxial layer and at the area of said Schottky contact, wherein said very thin silicon oxide layer is about 100 Å thick.

4. A lateral insulated gate transistor having a semiconductor substrate of a first conductivity type, an epitaxial surface layer of a second conductivity type opposite to that of the first on a first major surface of said substrate, a surface-adjoining channel region of said first conductivity type in said epitaxial layer and forming a p-n junction therewith, a surface-adjoining source region of said second conductivity type in said channel region, a Schottky contact at a surface of said epitaxial layer and spaced apart from said channel region, an insulating layer on said epitaxial surface layer and covering at least that portion of said channel region located between said source region and said Schottky contact, a gate electrode on said insulating layer, over said portion of the channel region and electrically isolated from said surface layer, a source electrode connected to the source region of the said transistor, a single anode-drain electrode connected to said Schottky contact, a substrate electrode on a second major surface of said substrate opposite to the first, a surface-adjoining drain region of said second conductivity type in said epitaxial layer, spaced apart from said channel region, and connected to said anode-drain electrode, and a very thin silicon oxide layer directly on a surface of said epitaxial layer and at the area of said Schottky contact, wherein said very thin silicon oxide layer is about 100 Å thick.

5. A lateral insulated gate transistor having a semiconductor substrate of a first conductivity type, an epitaxial surface layer of a second conductivity type opposite to that of the first on a first major surface of said substrate, a surface-adjoining channel region of said first conductivity type in said epitaxial layer and forming a p-n junction therewith, a surface-adjoining source region of said second conductivity type in said channel region, a Schottky contact at a surface of said epitaxial layer and spaced apart from said channel region, an insulating layer on said epitaxial surface layer and covering at lest that portion of said channel region located between said source region and said Schottky contact, a gate electrode on said insulating layer, over said portion of the channel region and electrically isolated from said surface layer, a source electrode connected to the source region of said transistor, a single anode-drain electrode connected to said Schottky contact, a substrate electrode on a second major surface of said substrate opposite to the first, a surface-adjoining drain region of said second conductivity type in said epitaxial layer, spaced apart form said channel region, and connected to said anode-drain electrode, a resistive element which connects said drain region to said anode-drain electrode, wherein said drain region is spaced apart from said Schottky contact, and a very thin silicon oxide layer directly on a surface of said epitaxial layer and at the area of said Schottky contact, wherein said very thin silicon oxide layer is about 100 Å thick.

* * * * *